United States Patent

Farassat

Patent Number: 5,170,928
Date of Patent: Dec. 15, 1992

[54] BONDING HEAD

[75] Inventor: Farhad Farassat, Taufkirchen, Fed. Rep. of Germany

[73] Assignee: Emhart, Inc., Del.

[21] Appl. No.: 806,770

[22] Filed: Dec. 12, 1991

[30] Foreign Application Priority Data

Jan. 5, 1991 [GB] United Kingdom ............. 9100225

[51] Int. Cl.$^5$ ............................................. H01L 21/60
[52] U.S. Cl. ................................. 228/4.5; 219/56.21
[58] Field of Search ............................... 228/1.1, 4.5; 219/56.21

[56] References Cited

U.S. PATENT DOCUMENTS 4,098,447 7/1978 Edson et al. ...................... 228/4.5
4,998,002 3/1991 Okikawa et al. .................. 228/4.5 X Primary Examiner—Kenneth J. Ramsey
Attorney, Agent, or Firm—Spencer T. Smith

[57] ABSTRACT

A bonding head for an automatic wire bonding machine, comprises a flame-off electrode which is adapted to be lifted away from an operative position in which it is used to form a ball on the end of the bonding wire, and a capillary through which the bonding wire is supplied to the flame-off electrode. The capillary is also adapted to apply pressure and ultrasonic energy to the wire when it is in contact with the surface to which it is to be bonded. The flame-off electrode is adapted to be lifted away from the operative position by movement of the bond head from a flame-off position to a bonding position.

3 Claims, 1 Drawing Sheet

BONDING HEAD

BACKGROUND OF THE INVENTION

This invention relates to automatic wire bonding machines for use in ball bonding. One known type of such machine comprises a flame-off electrode which is used to form a ball on the free end of a bonding wire fed through a capillary of a bond head, which electrode is lifted away from its ball forming or operating position, before the bond head is lowered into position for bonding.

Generally in a wire bonding machine of this type, the flame-off electrode is lifted away from its operating position by means of a solenoid, before the bond head is lowered into its bonding position. There are two principle disadvantages in this system involving the use of a solenoid. The first is that the speed of operation of the solenoid is slow, which limits the overall bonding time, and the machine throughput. The second disadvantage is that synchronisation between movement of the flame-off electrode and movement of the bond head can also cause problems, leading to a further limitation on the speed of operation of the machine. In order to avoid damage to either the flame-off electrode, or the capillary of the bond head, through which the wire is supplied, an additional margin for safety has to be built into the operation of the machine to attempt to ensure that contact between these two components is avoided.

BRIEF SUMMARY OF THE INVENTION

It is an object of the present invention to provide a bonding head for an automatic wire bonding machine in which the above disadvantages are reduced or substantially obviated.

The invention provides a bonding head for an automatic wire bonding machine, which head comprises a flame-off electrode which is adapted to be lifted away from an operative position in which it is used to form a ball on the end of the bonding wire and a bond head comprising a capillary through which the bonding wire is supplied to the flame-off electrode, which bond head is also adapted to apply pressure and ultrasonic energy to the wire when it is in contact with the surface to which it is to be bonded, characterised in that the flame-off electrode is adapted to be lifted away from said operative position by movement of the bond head from a flame-off position to a bonding position.

In a preferred embodiment of the bond head according to the invention, the flame-off electrode is provided with a substantially cylindrical hole extending along the length of the electrode, said hole being open at the end of the electrode which is adjacent to the capillary in the operating position and adapted to be connected at the other end to a supply of gas, and open at the other end. In this embodiment of the head according to the invention a gas such as forming gas may be fed through the electrode to ensure that the ball is formed on the end of the bonding wire under an atmosphere of the gas such as forming gas, in order to prevent oxidation. Where the ball formation is carried out under forming gas, it is possible to use copper wire as bonding wire.

DETAILED DESCRIPTION

Figure 1:
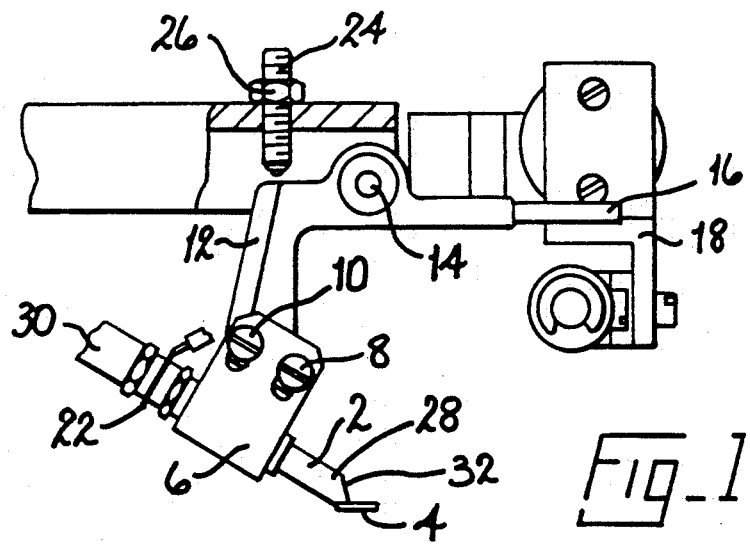
FIG. 1 is a side view of an embodiment of a flame-off electrode, in the operating position.

As can be seen in FIG. 1, a flame-off electrode 2 fitted with a gold plated electrode foot 4, comprises a cylindrical hole extending along the length of the electrode. The electrode 2 is mounted on a support 6 attached by means of two adjustment screws 8, 10 to a lever arm 12 pivoted on a bearing 14. The arm 12 is connected by means of a connecting pin 16 to the bondhead 18. The bondhead 18 is provided with an eccentric 20 for height adjustment of the capillary (not shown in FIG. 1). Electric current is supplied to the flame-off electrode 2 by means of a wire connected at 22.

The electrode assembly is adapted to rock about the bearing 14. Rotation of the assembly in the clockwise direction is limited by a limiting stop 24, the height of which can be adjusted by means of a screw 26.

The flame-off electrode 2 is hollow, forming a tube 28 through which gas can be blown from the end 30 remote from the spark gap to the open end 32 adjacent to the electrode foot 4.

Figure 2:
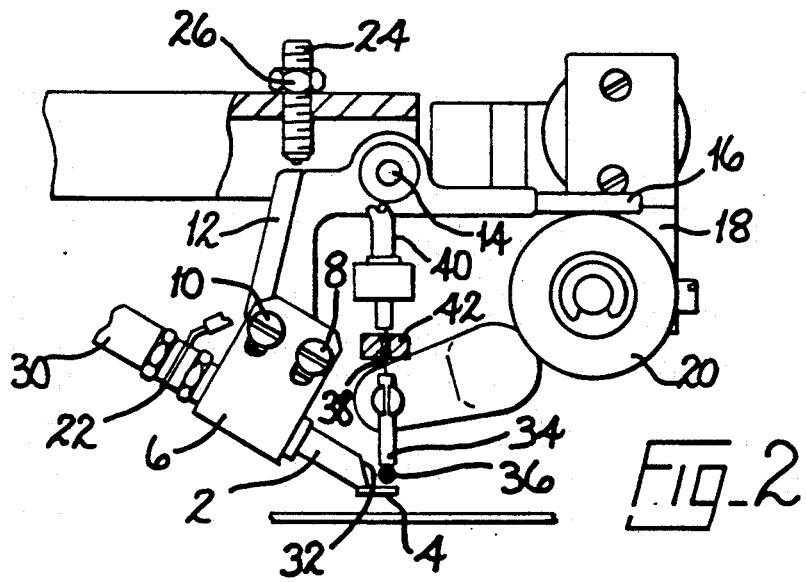
FIG. 2 is a schematic side view of the flame-off electrode in the operating position, and the capillary in the flame-off position.
Figure 3:
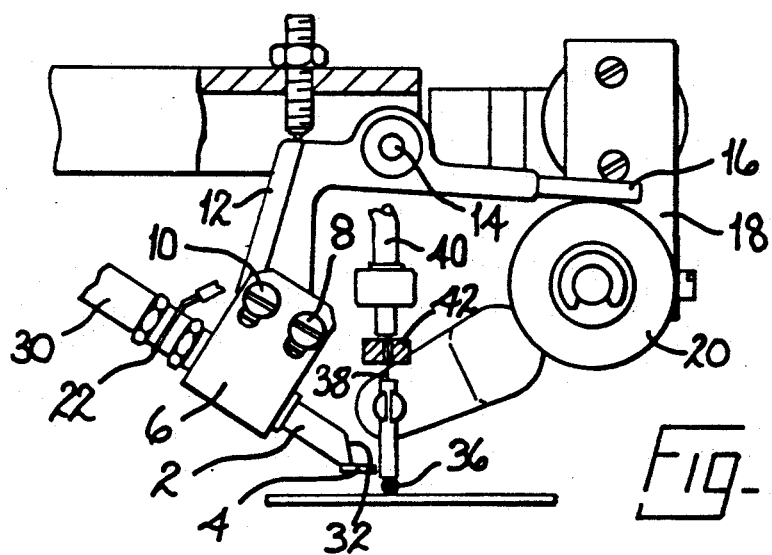
FIG. 3 is a schematic side view of the flame-off electrode in the non-operating position, and the capillary in the bonding position.

The flame-off electrode 2 is movable between a first, operative position, as shown in FIGS. 1 and 2, and a second inoperative position, as shown in FIG. 3. In the first, operative position, the foot 4 of the electrode 2 is situated vertically beneath the capillary 34, the capillary 34 being in the bonding position. A ball 36 is formed on the end of the bonding wire 38 supplied through the capillary 34, by creation of a spark between the electrode 2 and the wire 38, and the electrode is then moved from the operative to the inoperative position by moving the capillary 34 from the flame-off to the bonding position.

The electrode 2 moves out from the operative position at the same time as the capillary 34 is lowered, as a result of the mechanical connection between the bond head and the flame-off electrode 2.

The flame off position is adjustable mechanically and electronically with respect to its height above the bond position.

The wire 38 is supplied from a supply spool (not shown) through a vacuum feed tube 40. While in the operating position, the wire 38 is held by a wire clamp 42 which moves with the bond head 18. The vacuum feed tube 40 is fixed, and does not move during the bonding cycle.

The electrode assembly is prevented from moving too far by the limiting stop 24 as discussed above.

I claim:

1. A wire bonding machine comprising
   a flame-off electrode assembly,
   a lever arm secured to said electrode assembly,
   means for supporting said lever arm for pivotal displacement about a horizontal axis so that said flame-off electrode assembly can be pivoted from a lower operative position to an upper inoperative position,
   a bondhead assembly vertically displaceable between an elevated position and a lowered bonding position, said bondhead assembly further including means for engaging said lever arm and controlling the pivotal displacement thereof between said inoperative and operative positions as said bondhead assembly is vertically displaced between said elevated and lowered positions.

2. A wire bonding machine according to claim 1, further comprising means for stopping the pivotal displacement of said lever arm at a selected upper inoperative position.

3. A wire bonding machine according to claim 1, wherein said engaging means comprises means for changing said lower operative position of said flame-off electrode assembly.

* * * * *